US012715024B2

(12) United States Patent
Wu et al.

(10) Patent No.: US 12,715,024 B2
(45) Date of Patent: Aug. 25, 2026

(54) ELECTRONIC DEVICE CONTROL METHOD AND APPARATUS, ELECTRONIC DEVICE, AND STORAGE MEDIUM

(71) Applicant: BITMAIN TECHNOLOGIES INC., Beijing (CN)

(72) Inventors: Chao Wu, Beijing (CN); Wenming Gui, Beijing (CN); Qiang Zhang, Beijing (CN); Zhaodi Zhou, Beijing (CN)

(73) Assignee: BITMAIN TECHNOLOGIES INC., Beijing (CN)

( * ) Notice: Subject to any disclaimer, the term of this patent is extended or adjusted under 35 U.S.C. 154(b) by 284 days.

(21) Appl. No.: 18/573,892

(22) PCT Filed: May 16, 2022

(86) PCT No.: PCT/CN2022/093109

§ 371 (c)(1),
(2) Date: Dec. 22, 2023

(87) PCT Pub. No.: WO2022/242606

PCT Pub. Date: Nov. 24, 2022

(65) Prior Publication Data

US 2024/0198395 A1 Jun. 20, 2024

(30) Foreign Application Priority Data

May 20, 2021 (CN) ......................... 202110552639.0

(51) Int. Cl.
*B08B 9/00* (2006.01)
*H05K 7/20* (2006.01)

(52) U.S. Cl.
CPC ........... *B08B 9/00* (2013.01); *H05K 7/20209* (2013.01)

(58) Field of Classification Search
None
See application file for complete search history.

(56) References Cited

U.S. PATENT DOCUMENTS

2010/0084123 A1 4/2010 Shishido et al.
2012/0275115 A1 11/2012 Chen
(Continued)

FOREIGN PATENT DOCUMENTS

CN 102026524 A 4/2011
CN 103213492 A 7/2013
(Continued)

OTHER PUBLICATIONS

English translation CN109654054, accessed on Oct. 2025. (Year: 2019).*

(Continued)

*Primary Examiner* — Kaj K Olsen
*Assistant Examiner* — Arlyn I Rivera-Cordero

(57) ABSTRACT

Embodiments of the present disclosure provide an electronic device control method and apparatus, an electronic device, and a storage medium. The electronic device control method includes: selecting a target mode from optional modes of a fan of an electronic device, the optional modes including a cleaning mode and a heat dissipation mode, where in the cleaning mode, the fan provides at least two different air strengths, and in the heat dissipation mode, the fan provides a single air strength when a heat dissipation level is not switched; generating a control signal based on the target mode; and controlling, based on the control signal, the fan to provide an air strength.

17 Claims, 4 Drawing Sheets

S110: Select a target mode from optional modes of a fan of an electronic device, the optional modes including a cleaning mode and a heat dissipation mode, where in the cleaning mode, the fan provides at least two different air strengths; and in the heat dissipation mode, the fan provides a single air strength when a heat dissipation level is not switched

↓

S120: Generate a control signal based on the target mode

↓

S130: Control, based on the control signal, the fan to provide an air strength

(56) References Cited

U.S. PATENT DOCUMENTS

| | | | |
|---|---|---|---|
| 2016/0238014 A1 | 8/2016 | Liu et al. | |
| 2016/0282807 A1 | 9/2016 | Kinoshita et al. | |
| 2018/0141092 A1* | 5/2018 | Davies | F04D 17/04 |

FOREIGN PATENT DOCUMENTS

| | | |
|---|---|---|
| CN | 103362840 A | 10/2013 |
| CN | 103362840 B | 5/2016 |
| CN | 105718352 A | 6/2016 |
| CN | 107165871 A | 9/2017 |
| CN | 107548267 A | 1/2018 |
| CN | 109563844 A | 4/2019 |
| CN | 109654054 A | 4/2019 |
| CN | 110136755 A | 8/2019 |
| CN | 110454906 A | 11/2019 |
| CN | 112196812 A | 1/2021 |
| JP | 2011206816 A | 10/2011 |
| JP | 2015072320 A | 4/2015 |
| RU | 2614982 C2 | 4/2017 |
| WO | WO2016068158 A1 | 5/2016 |

OTHER PUBLICATIONS

CN 110454906 English translation, accessed on Feb. 2026. (Year: 2019).*

Extended European Search Report dated Sep. 10, 2024 for Application No. 22803926.9, pp. 7.

Notice of Allowance dated May 20, 2024 for Russian Application No. 2023134202/07(075283), pp. 26.

International Search Report dated Jul. 29, 2022 regarding International Application No. PCT/CN2022/093109, pp. 13.

The Notice of the First Examination Opinion from National Intellectual Property Administration, PRC, dated Jan. 4, 2024 for Application No. 2021105526390, pp. 10.

* cited by examiner

S110: Select a target mode from optional modes of a fan of an electronic device, the optional modes including a cleaning mode and a heat dissipation mode, where in the cleaning mode, the fan provides at least two different air strengths; and in the heat dissipation mode, the fan provides a single air strength when a heat dissipation level is not switched

↓

S120: Generate a control signal based on the target mode

↓

S130: Control, based on the control signal, the fan to provide an air strength

FIG. 1

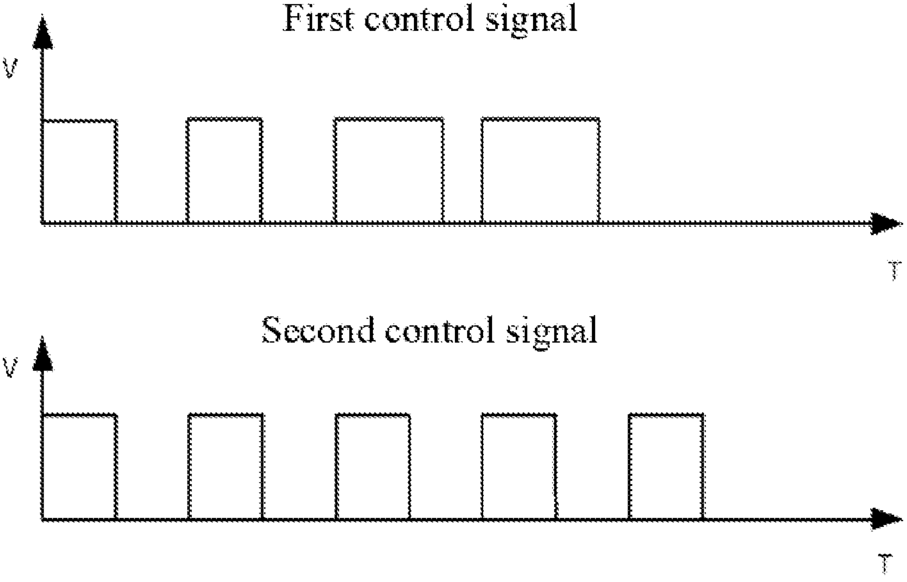

FIG. 2A

S210: Determine a cleaning delay

S220: Determine a cleaning time based on the cleaning delay, where a target mode in which a fan is working at the cleaning time is a cleaning mode

ELECTRONIC DEVICE CONTROL METHOD AND APPARATUS, ELECTRONIC DEVICE, AND STORAGE MEDIUM

CROSS-REFERENCE TO RELATED APPLICATION

The present application is a national stage of International Application No. PCT/CN2022/093109, filed on May 16, 2022, which claims the priority to Chinese Patent Application No. 202110552639.0, filed with the China National Intellectual Property Administration on May 20, 2021 and entitled “ELECTRONIC DEVICE CONTROL METHOD AND APPARATUS, ELECTRONIC DEVICE, AND STORAGE MEDIUM”, both of the above applications are incorporated herein by reference in their entireties.

TECHNICAL FIELD

The present disclosure relates to the technical field of electronics, and in particular, to an electronic device control method and apparatus, an electronic device, and a storage medium.

BACKGROUND

An electronic device consumes energy during operation, and most of the consumed energy will be converted into heat. To protect the electronic device against failure or rapid aging due to overheating, a heat dissipation module, such as a fan, is usually arranged inside the device. Moreover, a vent is formed in a housing of the device, to facilitate air convection for heat dissipation.

However, in some cases, dust, foreign objects, or flying insects may enter the electronic device, which makes the device not clean enough, and thus results in a declined heat dissipation capability and other problems.

SUMMARY

Embodiments of the present disclosure provide an electronic device control method and apparatus, an electronic device, and a storage medium.

In a first aspect, an embodiment of the present disclosure provides an electronic device control method. The method includes:

selecting a target mode from optional modes of a fan of an electronic device, the optional modes including a cleaning mode and a heat dissipation mode, where in the cleaning mode, the fan provides at least two different air strengths, and in the heat dissipation mode, the fan provides a single air strength when a heat dissipation level is not switched;

generating a control signal based on the target mode; and controlling, based on the control signal, the fan to provide an air strength.

Based on the above solution, the generating a control signal based on the target mode includes:

generating a first control signal if the target mode is the cleaning mode, where the first control signal includes at least two pulse width modulation (PWM) signals with different duty cycles; or the first control signal includes at least two direct current (DC) control signals with different high voltage values.

Based on the above solution, the generating a control signal based on the target mode includes:

generating a second control signal if the target mode is the heat dissipation mode, where the second control signal is a PWM signal with a single duty cycle or a DC signal with a single voltage value.

Based on the above solution, the selecting a target mode from optional modes of a fan of an electronic device includes:

selecting the cleaning mode as the target mode at a cleaning time; and selecting the heat dissipation mode as the target mode at a time other than the cleaning time.

Based on the above solution, the method further includes:

determining a cleaning delay; and determining the cleaning time based on the cleaning delay.

Based on the above solution, the determining a cleaning delay includes at least one of:

determining the cleaning delay after the electronic device is powered on;

determining the cleaning delay after the electronic device is powered on and runs for a preset duration;

determining the cleaning delay after the electronic device has completed previous cleaning; and determining the cleaning delay based on a predetermined period after the electronic device is powered on and has completed first-time cleaning.

Based on the above solution, the determining a cleaning delay includes at least one of:

determining the cleaning delay based on a randomized algorithm;

determining the cleaning delay based on a device number of the electronic device;

determining the cleaning delay based on a local area network address of the electronic device in a local area network where the electronic device is located; and determining the cleaning delay based on a group number of a device group to which the electronic device belongs.

Based on the above solution, the running status information includes load status information indicating a load status of the electronic device and/or temperature status information indicating an internal temperature status of the electronic device; and the method further includes:

determining, based on the load status information, a time at which a load rate of the electronic device is lower than a load threshold as the cleaning time;

and/or determining, based on the temperature status information, the time at which a temperature value of the powered-on electronic device is lower than a preset temperature value as the cleaning time.

Based on the above solution, the generating a control signal based on the target mode includes:

obtaining a minimum air strength required to dissipate heat from the electronic device if the target mode is the cleaning mode; and generating the control signal based on the minimum air strength required to dissipate heat from the electronic device, where the control signal controls a minimum air strength provided by the fan to be greater than or equal to the minimum air strength required to dissipate heat from the electronic device.

In a second aspect, an embodiment of the present disclosure provides an electronic device control apparatus. The apparatus includes:

a selection module configured to select a target mode from optional modes of a fan of an electronic device, the optional modes including a cleaning mode and a heat dissipation mode, where in the cleaning mode, the fan provides at least two different air strengths, and in the heat dissipation mode, the fan provides a single air strength when a heat dissipation level is not switched;

a generation module configured to generate a control signal based on the target mode; and a control module configured to control, based on the control signal, the fan to provide an air strength.

Based on the above solution, the generation module is specifically configured to generate a first control signal if the target mode is the cleaning mode, where the first control signal includes at least two pulse width modulation (PWM) signals with different duty cycles; or the first control signal includes at least two direct current (DC) control signals with different high voltage values.

Based on the above solution, the generation module is specifically configured to generate a second control signal if the target mode is the heat dissipation mode, where the second control signal is a PWM signal with a single duty cycle or a DC signal with a single voltage value.

Based on the above solution, the selection module is specifically configured to: select the cleaning mode as the target mode at a cleaning time; and select the heat dissipation mode as the target mode at a time other than the cleaning time.

Based on the above solution, the apparatus further includes:

a first determination module configured to determine a cleaning delay; and a second determination module configured to determine the cleaning time based on the cleaning delay.

Based on the above solution, the first determination module is specifically configured to perform at least one of operations of:

determining the cleaning delay after the electronic device is powered on;

determining the cleaning delay after the electronic device is powered on and runs for a preset duration;

determining the cleaning delay after the electronic device has completed previous cleaning; and determining the cleaning delay based on a predetermined period after the electronic device is powered on and has completed first-time cleaning.

Based on the above solution, the first determination module is specifically configured to perform at least one of operations of:

determining the cleaning delay based on a randomized algorithm;

determining the cleaning delay based on a device number of the electronic device;

determining the cleaning delay based on a local area network address of the electronic device in a local area network where the electronic device is located; and determining the cleaning delay based on a group number of a device group to which the electronic device belongs.

Based on the above solution, the running status information includes load status information indicating a load status of the electronic device and/or temperature status information indicating an internal temperature status of the electronic device; and the apparatus further includes a third determination module, where the third determination module is specifically configured to: determine, based on the load status information, the time at which a load rate of the electronic device is lower than a load threshold as the cleaning time; and/or determine, based on the temperature status information, the time at which a temperature value of the powered-on electronic device is lower than a preset temperature value as the cleaning time.

Based on the above solution, the generation module is specifically configured to: obtain a minimum air strength required to dissipate heat from the electronic device if the target mode is the cleaning mode; and generate the control signal based on the minimum air strength required to dissipate heat from the electronic device, where the control signal controls a minimum air strength provided by the fan to be greater than or equal to the minimum air strength required to dissipate heat from the electronic device.

In a third aspect, an embodiment of the present disclosure provides an electronic device. The electronic device includes:

a memory configured to store processor-executable instructions; and a processor connected to the memory, where the processor is configured to perform the electronic device control method according to any of the foregoing technical solutions.

In a fourth aspect, an embodiment of the present disclosure provides a non-transitory computer-readable storage medium storing instructions that, when executed by a processor of a computer, enable the computer to perform the electronic device control method according to any of the foregoing technical solutions.

The technical solutions provided in the embodiments of the present disclosure may have the beneficial effects as follows.

In the technical solutions provided in the embodiments of the present disclosure, an electronic device includes a fan, and the fan has two optional working modes (e.g., optional modes), namely, a cleaning mode and a heat dissipation mode. In the heat dissipation mode, the fan mainly dissipates heat from the electronic device by means of a single air strength. In the cleaning mode, the fan may automatically switch the air strength. By controlling the switching of the air strength, the air strength inside the electronic device is changed. As a result, the dirt, foreign objects, or flying insects inside the electronic device may experience force changes under different air strengths, and the dirt, foreign objects, or flying insects stuck or adhered to the electronic device may also experience force changes, and are thus blown out of the device by means of the air strength provided by the fan in the case of the force changes, thereby implementing cleaning of the electronic device.

BRIEF DESCRIPTION OF DRAWINGS

The accompanying drawings herein are incorporated into and constitute a part of the description, illustrate embodiments consistent with the present disclosure, and are used together with the description to explain the principles of the present disclosure.

FIG. 1 is a schematic flowchart of an electronic device control method according to an exemplary embodiment.

FIG. 2A is a schematic diagram of time domains of control signals generated by an electronic device according to an exemplary embodiment.

DESCRIPTION OF EMBODIMENTS

Figures 2B, 3:
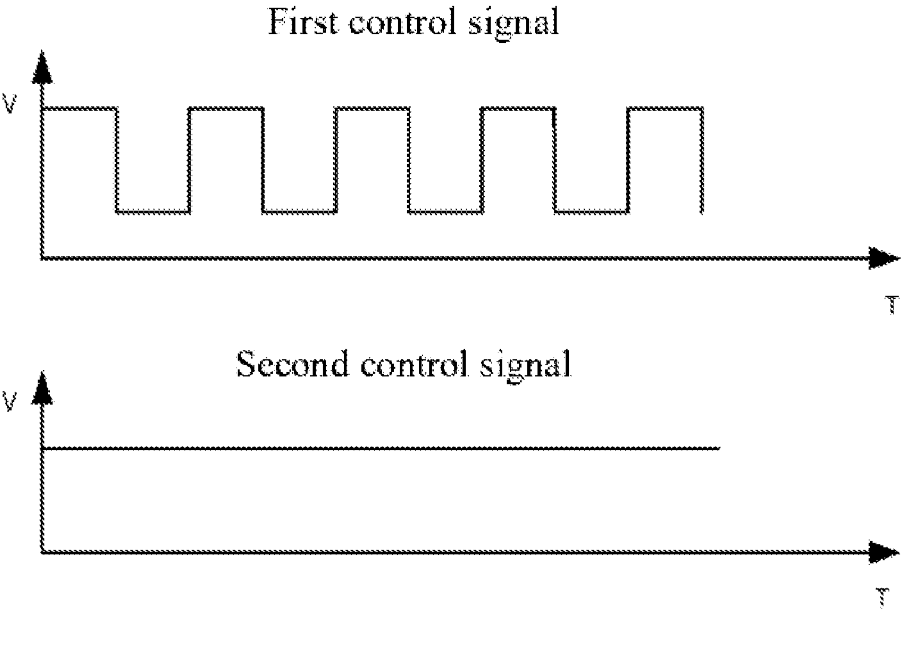
FIG. 2B is a schematic diagram of time domains of control signals generated by an electronic device according to an exemplary embodiment.
FIG. 3 is a schematic flowchart of an electronic device control method according to an exemplary embodiment.

Exemplary embodiments are described in detail herein, with examples shown in the accompanying drawings. Unless otherwise indicated, the same numbers in different figures represent the same or similar elements when the following description refers to the figures. Implementations described in the following exemplary embodiments do not represent all implementations consistent with the present disclosure. Instead, the implementations are merely examples of apparatuses consistent with some aspects of the present disclosure as detailed in the appended claims.

As shown in FIG. 1, an embodiment of the present disclosure provides an electronic device control method.

In S110, a target mode is selected from optional modes of a fan of an electronic device, the optional modes including a cleaning mode and a heat dissipation mode, where in the cleaning mode, the fan provides at least two different air strengths, and in the heat dissipation mode, the fan provides a single air strength when a heat dissipation level is not switched.

In S120, a control signal is generated based on the target mode.

In S130, the fan is controlled, based on the control signal, to provide an air strength.

The electronic device in this embodiment may be an electronic device including a fan and a heat generation module. The fan is originally used to dissipate heat from the heat generation module, but in this embodiment of the present disclosure, working modes are added to the fan, such that the fan has the cleaning mode in addition to the heat dissipation mode, and in the cleaning mode, the fan can provide for cleaning of the electronic device by switching at least two air strengths of the fan itself.

The electronic device provided in the embodiments of the present disclosure may be various types of electronic devices. For example, the electronic device may be a terminal device or a server. Exemplarily, the terminal device may include a personal computer (PC), etc. The PC may include a desktop PC, a notebook computer, a large-screen display device, etc. The server may be a rack server and/or a blade server.

In some embodiments, the electronic device may be an information technology (IT) device. The IT device includes various devices involved in IT computing. For example, the IT device may serve as a device of a blockchain node. Exemplarily, the IT device may be a miner.

The electronic device may include heat generation structures that generate heat in a working state, such as a processor and a memory. These heat generation structures may be the foregoing heat generation modules.

Exemplarily, the processor includes, but not limited to, a central processing unit, a microcontroller, an embedded controller, and/or a graphics processing unit.

Exemplarily, the memory includes, but not limited to, an internal memory, a magnetic disk, a flash memory, a hard disk, or other electronic components configured to temporally store and store information within the device.

In some embodiments, such an electronic device may include one fan. In some other embodiments, one electronic device is provided with a plurality of fans. The plurality of fans may be divided into two fan groups, one fan group including at least one fan. One fan group provides an air strength for outward air extraction, while the other fan group provides an air strength for inward air extraction, thereby achieving high-air-strength heat dissipation or high-air-strength cleaning.

Exemplarily, if the fan is working in the cleaning mode, the fan may provide at least a first air strength and a second air strength.

In some other embodiments, the fan working in the cleaning mode may further provide a third air strength, etc. in addition to the first air strength and the second air strength.

In this embodiment of the present disclosure, the fan working in the cleaning mode is not subjected to one-time air strength switching, but can repeatedly switch between at least two air strengths. Exemplarily, the fan periodically switches between the first air strength and the second air strength.

It is to be understood that the first air strength and the second air strength may both be used in a general sense. In some embodiments, the first air strength and the second air strength represent specific air strength values that are different from each other. In this case, exemplarily, the first air strength and the second air strength may respectively correspond to a maximum air strength and a minimum air strength that the fan provides. Exemplarily, when the fan provides the first air strength, the fan may rotate at a maximum rotational speed; and when the fan provides the second air strength, the fan may rotate at a non-zero minimum rotational speed. If the fan is working in the cleaning mode, the fan can switch between the maximum air strength and the minimum air strength, thereby implementing efficient cleaning inside the electronic device.

In some other embodiments, the first air strength and the second air strength represent different air strength ranges. For example, the first air strength and the second air strength represent different air strength ranges. In this case, if the fan is working in the cleaning mode, the fan repeatedly switches within the air strength ranges corresponding to the first air strength and the second air strength.

The dirt, foreign objects, flying insects, or other objects to be cleaned inside the electronic device will experience force changes or switching under different air strengths, and are thus blown out of the electronic device through an opening in a housing of the electronic device in the case of the force changes, thereby implementing internal cleaning of the electronic device.

In the heat dissipation mode, the fan may have a plurality of air strength gears. If the fan is working in the heat dissipation mode, the fan provides a single air strength when no air strength gear switching is performed, to implement stable heat dissipation.

In this embodiment of the present disclosure, the control signal generated based on the target working mode includes, but not limited to, a driving signal for the fan. For example, the control signal may be a power supply signal for a motor of the fan.

In some embodiments, S120 may include:

generating a first control signal if the target mode is the cleaning mode, where the first control signal includes at least two pulse width modulation (PWM) signals with different duty cycles; or the first control signal includes at least two direct current (DC) control signals with different high voltage values.

If the target mode is the cleaning mode, the first control signal is generated.

The first control signal may be divided into two types, which may be either a PWM signal or a DC signal.

Since the fan needs to switch the air strength when the fan is in the cleaning mode, the first control signal has a signal characteristic of allowing the fan to automatically switch between different air strengths. Exemplarily, the duty cycle of the PWM signal controls the rotational speed of the fan. Generally, a higher rotational speed provides for a greater air strength. In view of this, if the fan is working in the cleaning mode, the first control signal includes at least two PWM signals with different duty cycles. For example, it is to be understood that the PWM signals with two duty cycles that are included in the first control signal may have the same period but different duty cycles. For example, if one PWM signal has a duty cycle of 50%, and the other PWM signal has a duty cycle of 70%, the PWM signal with the duty cycle of 70% will drive the fan to rotate faster than the PWM signal with the duty cycle of 50%, thereby providing a greater air strength.

The PWM signals with different duty cycles that are included in the first control signal are alternated in a time domain. A duration that a PWM signal with one duty cycle occurs in the first control signal a single time is not less than one period corresponding to the PWM signal.

In this embodiment of the present disclosure, a first PWM signal and a second PWM signal may be PWM signals with the same duty cycle. Exemplarily, both the first PWM signal and the second PWM signal may be PWM signals with a duty cycle of 50%.

The first control signal may be a continuously distributed PWM signal in the time domain. In this embodiment of the present disclosure, the first PWM signal and the second PWM signal are provided as an example for illustration. The first control signal includes the first PWM signal and the second PWM signal, and the second period is different from the first period:

the first PWM signal is configured to control the fan to provide the first air strength; and the second PWM signal is configured to control the fan to provide the second air strength.

FIG. 2 illustrates a schematic diagram of a spaced distribution of a first PWM signal and a second PWM signal of a first control signal in a time domain. In FIG. 2, the vertical axis represents a voltage (V) axis, and the horizontal axis represents a time (T) axis. Based on FIG. 2, it can be seen that the first control signal has two PWM signals with different periods.

The first PWM signal and the second PWM signal may be PWM signals for controlling the rotational speed of the fan, and different duty cycles result in different rotational speeds of the fan, such that the fan can be controlled to provide different air strengths.

In the above example, the first control signal including two PWM signals with different duty cycles is taken as an example. During specific implementation, the first control signal may include PWM signals with three or more periods.

In some embodiments, the PWM signals included in the first control signal are switched, with a first duration as a switching duration, between the first PWM signal and the second PWM signal, where the first duration is at least greater than a larger period of the first PWM signal and the second PWM signal.

Here, the first duration is respectively greater than the larger period of the first PWM signal and the second PWM signal, which can ensure that each of durations for which the first PWM signal and the second PWM signal last in the first control signal a single time is at least one period.

Exemplarily, the first duration is a common multiple of the periods of the first PWM signal and the second PWM signal. For example, a ratio of the first duration to the period of the first PWM signal is S1, and a ratio of the second duration to the period of the second PWM signal is S2. S2 and S1 are both positive integers greater than or equal to 2.

In some embodiments, the first control signal is switched, with a preset number of periods, between the first PWM signal and the second PWM signal. For example, if the preset number of periods is P, the first control signal includes a continuous distribution of P first PWM signals followed by a continuous distribution of P second PWM signals, and this sequence continues in a cyclic manner.

In some embodiments, S210 may include:

generating the first control signal within a second duration if the target mode is the cleaning mode.

In an embodiment, the second duration is N times of the first duration, N being a positive integer greater than or equal to 2. In another embodiment, the second duration may be an integral multiple of a sum of durations of P first periods and P second periods.

The second duration is N times of the first duration. In this embodiment of the present disclosure, the first control signal lasts for the second duration at one time, and is switched, with the first duration as a switching period, between the first PWM signal and the second PWM signal, thereby controlling the fan to periodically switch the air strength with the first duration as the period within the second duration.

In this embodiment of the present disclosure, a range of values for the second duration may be measured in minutes. For example, the range of values for the second duration may be 5 minutes to 59 minutes. Exemplarily, the second duration may be set to 5 minutes, 10 minutes, 15 minutes, 20 minutes, etc, which are merely specific examples of the range of values for the second duration, and the second duration is not limited thereto during specific implementation. It is to be understood that assuming that the second duration is 10 minutes, the first control signal will last for 10 minutes, and the air strength provided by the fan will be switched between the first air strength and the second air strength for 10 minutes. Within the 10 minutes, objects inside the electronic device will be cleaned away after being subjected to alternating forces applied by the first air strength and the second air strength. Within 10 minutes, an instance of relatively complete and thorough cleaning can be completed without having excessive negative impacts on heat dissipation due to the switching of the air strength during the process.

The first control signal is a DC signal, and a voltage value corresponding to the DC signal is positively related to the air strength that the fan can provide. Therefore, the first control signal includes at least DC signals of two voltage values if the fan is working in the cleaning mode. For example, the first control signal is alternately switched between a 12V direct current voltage signal and a 6V direct current signal in the time domain.

Similarly, if the first control signal is a DC signal of two different voltage values, a duration for which a DC signal of one voltage value lasts in the first control signal a single time may allow the fan to rotate by at least W turns, where W may be any positive integer.

In some embodiments, S120 includes:

generating a second control signal if the target mode is the heat dissipation mode, where the second control signal is a PWM signal with a single duty cycle or a DC signal with a single voltage value.

The second control signal may be the PWM signal with the single duty cycle or the DC signal with the single voltage value.

Because the second control signal is the PWM signal with the single duty cycle or the DC signal with the single voltage value, the fan is driven by the second control signal to rotate at a constant speed after stabilization, thereby providing a stable single air strength.

FIG. 2A is a schematic diagram of comparison in the time domain when a first control signal and a second control signal generated by an electronic device are both PWM signals. As shown in FIG. 2A, the first control signal has at least two PWM signals with different duty cycles in the time domain, and the second control signal has only a PWM signal with one duty cycle in the time domain.

FIG. 2B is a schematic diagram showing that a first control signal and a second control signal generated by an electronic device are DC signals. In the time domain, the first control signal is a DC signal with two voltage values, and the second control signal is a DC signal with only a single voltage value. In both FIGS. 2A and 2B, the horizontal axis represents a time axis, and the vertical axis represents a voltage axis.

In some embodiments, S110 may include:

- selecting the cleaning mode as the target mode at a cleaning time; and
- selecting the heat dissipation mode as the target mode at a time other than the cleaning time.

In this embodiment of the present disclosure, the cleaning time may generally refer to any time at which the fan implements self-cleaning of the electronic device by switching an air strength. The cleaning time may include a start time, an end time, and an intermediate time between the start time and the end time. The start time may be a time at which the fan starts to enter the cleaning mode. The end time may be a time at which the fan exits the cleaning mode. The intermediate time is a working time at which the fan is working in the cleaning mode after entering the cleaning mode.

In some embodiments, a cleaning duration corresponding to the cleaning time may be predetermined, or dynamically determined. If the cleaning duration is dynamically determined, a duration value may be randomly generated by using a randomized algorithm, etc. To ensure a minimum duration for cleaning, a cleaning duration may be randomly generated on the basis of generating the minimum cleaning duration by using the randomized algorithm.

The determination of the end time is related to the cleaning duration. For example, after the starting time, the end time is reached after the cleaning duration. The cleaning duration may be a pre-determined fixed duration. When the cleaning duration is dynamically determined, if it is determined that temperature of the electronic device reaches a temperature threshold at a certain moment of the cleaning time, it is considered that the end time for the cleaning time is reached. Alternatively, power of the electronic device is detected at the cleaning time, and if the power of the electronic device exceeds a power threshold, it may also be considered that the end time for the cleaning time is reached.

If the current time is the cleaning time, it is considered that the current target mode of the fan is the cleaning mode, otherwise, the current target mode of the fan is the heat dissipation mode. The time other than the cleaning time may be any time, other than the cleaning time, after the electronic device is powered on and the fan enters the working state.

In some embodiments, as shown in FIG. 3, the method further includes:

- S210: determining a cleaning delay; and
- S220: determining a cleaning time based on the cleaning delay, where a target mode in which a fan is working at the cleaning time is a cleaning mode.

In this embodiment of the present disclosure, the method may be applied to a device space with a large number of devices. A plurality of electronic devices located in the same device space share a power supply in the device space, such as at the same cleaning time, the problem of overloading of a power supply system in the device space is possibly caused.

Thus, in this embodiment of the present disclosure, the cleaning delay may first be determined, and the cleaning time is then determined based on the determined cleaning delay.

Exemplarily, the plurality of electronic devices in the device space determine cleaning delays at the same time, and at least some of the electronic devices have different cleaning delays. As such, at least some of the electronic devices have different cleaning times, such that a power supply load is balanced in the time domain, thereby reducing a power supply peak, and improving the power supply stability of the power supply system.

It is to be understood that at the time of determination of the cleaning delay, the cleaning time is reached after delaying the cleaning delay. That is, it may be considered that at the determination time of determining the cleaning delay, the time after a delay equal to the cleaning delay is the start time for the cleaning time.

In some embodiments, the determining a cleaning delay includes at least one of:

- determining the cleaning delay after the electronic device is powered on;
- determining the cleaning delay after the electronic device is powered on and runs for a preset duration;
- determining the cleaning delay after the electronic device has completed previous cleaning; and
- determining the cleaning delay based on a predetermined period after the electronic device is powered on and has completed first-time cleaning.

The electronic device will be started after being powered on. After the electronic device is successfully started, the cleaning delay is determined.

After the electronic device has been cleaned once, a cleaning delay of a next cleaning time is determined. At the very beginning of power-on of the electronic device, there is only a small amount of heat generated by the electronic device itself and accumulated. At this time, the use of the fan for heat dissipation to perform self-cleaning of the device by switching an air strength can reduce a negative impact of the fan during cleaning on heat dissipation of the electronic device as much as possible.

When the electronic device is powered on, many applications need to be started, or many initialization configurations, etc. of the device need to be completed, such that a system load rate of the electronic device may be high at the power-on time. In this case, the cleaning delay may be determined after the electronic device is powered on and stably runs for a period of time. The preset duration may be any duration value, for example, 10 minutes, half an hour, or other preset duration values. After being powered on and running for a period of time, the electronic device itself is running smoothly, and at this time, there is a small amount of heat generated by the device itself and accumulated after powering on and running for the preset duration. Therefore, in this case, the use of the fan for heat dissipation for cleaning inside the device can reduce the negative impact on heat dissipation of the electronic device.

In some embodiments, after the electronic device is powered on and then cleaned, the cleaning delay is periodically determined. Here, the period for periodically determining the cleaning delay is the above predetermined period. The predetermined period may be measured in days, such as half a day, one day, or two days. Certainly, the predetermined period may also be measured in hours, such as 3 hours, 6 hours, 12 hours, or 24 hours.

After the cleaning delay is determined, the time for determining the cleaning delay is taken as the start time, and the cleaning time is reached after a delay equal to the duration of the cleaning delay. Then, by generating the first control signal, the fan is controlled to switch between the first air strength and the second air strength so as to implement cleaning inside the electronic device.

In general, there are many methods for determining the time for determining the cleaning delay. Provided above are merely several possible embodiments, and the method are not limited to the above examples during specific implementation.

Exemplarily, cleaning delays corresponding to two adjacent cleaning times may be the same or different. The cleaning delays for the two adjacent cleaning times are the same, which indicates that the electronic device may periodically perform self-cleaning by using the fan of the electronic device itself.

In some embodiments, the determining a cleaning delay includes at least one of:

- determining the cleaning delay based on a randomized algorithm;
- determining the cleaning delay based on a device number of the electronic device;
- determining the cleaning delay based on a local area network address of the electronic device in a local area network where the electronic device is located; and
- determining the cleaning delay based on a group number of a device group to which the electronic device belongs.

If the electronic device determines the cleaning delay by using the randomized algorithm, a duration value corresponding to the cleaning delay is a random value calculated by the randomized algorithm.

The plurality of electronic devices in the device space have their respective device numbers, and if the cleaning delay is determined according to the same algorithm based on their respective device numbers, it can be ensured that different electronic devices may have different cleaning delays determined even at the same time point. Here, the device number includes, but not limited to, an international mobile equipment identity (IMEI), or a media access control (MAC) address of the electronic device. Typically, different devices have different IMEIs and MAC addresses, which allows for differentiation of the cleaning delays of devices even if they are located in the same device space, or in different device spaces connected to the same power supply system.

In some embodiments, the plurality of electronic devices may belong to the local area network. Within the local area network, local area network addresses are assigned, which addresses may be assigned internet protocol (IP) addresses of the local area network. Different electronic devices within the same local area network are assigned with different IP addresses, such that the cleaning delay is determined based on the IP addresses divided within the local area network, and different electronic devices may also determine different cleaning delays.

In some other embodiments, the local area network address further includes, but not limited to, a virtual local area network (VLAN) identity (ID).

In some embodiments, the plurality of electronic devices are divided into a plurality of device groups, and the device groups are assigned with group numbers. Accordingly, the electronic devices may determine the cleaning delays according to their respective group numbers. If the group numbers are different, different cleaning delays are determined at the same time when the same determining algorithm is used.

If the cleaning delays are different, the plurality of electronic devices do not control, at the same time, air strength changes of the fan for self-cleaning of the devices.

In some embodiments, the determining a cleaning time includes:

- determining running status information of the electronic device; and
- determining the cleaning time based on the running status information.

The cleaning time is determined based on the running state information of the electronic device itself. The running state information may indicate a load status and/or a temperature status, etc.

Determining the cleaning time based on the running status information can minimize the negative impact of reusing the fan for heat dissipation on heat dissipation.

In some embodiments, the running status information includes load status information indicating a load status of the electronic device and/or temperature status information indicating an internal temperature status of the electronic device; and The determining the cleaning time based on the running state includes:

- determining, based on the load status information, a time at which a load rate of the electronic device is lower than a load threshold as the cleaning time;

and/or

- determining, based on the temperature status information, the time at which a temperature value of the powered-on electronic device is lower than a preset temperature value as the cleaning time.

If the electronic device itself has a relatively low load, there is a small probability of heat accumulation within a short period of time. In this case, the fan may be mainly used for self-cleaning of the device.

If the electronic device itself has a relatively low temperature, there is a small probability that the device itself generates heat and then causes the temperature to sharply rise to a higher temperature. In this case, similarly, the air strength of the fan can be adjusted for the self-cleaning of the device.

In some embodiments, S120 may further include:

obtaining a minimum air strength required to dissipate heat from the electronic device if the target mode is the cleaning mode; and generating the control signal based on the minimum air strength required to dissipate heat from the electronic device, where the control signal controls a minimum air strength provided by the fan to be greater than or equal to the minimum air strength required to dissipate heat from the electronic device.

The determining the minimum air strength required for the electronic device may include:

determining a minimum air strength required to maintain the temperature of the electronic device to be less than or equal to a preset temperature without overheating based on a current temperature of the electronic device, an environment temperature of an environment where the electronic device is located, and a working frequency of a heat generation module in the electronic device. The heat generation module includes, but not limited to, a processor and/or a memory, etc. The memory includes, but not limited to, an internal memory, etc. The processor includes, but not limited to, a CPU, a GPU, or a computing power board.

Where the control signal is generated when the target mode is the cleaning mode, the minimum air strength required to dissipate heat from the electronic device is considered, such that the minimum air strength provided by the fan is not less than the minimum air strength required for the electronic device, thereby guaranteeing a heat dissipation effect and also achieving a cleaning effect.

Exemplarily, in the cleaning mode, the fan switches between at least two air strengths not less than the minimum air strength required to dissipate heat from the electronic device.

An embodiment provides an electronic device control method, which may include: generating a first control signal; and controlling, based on the first control signal, an air strength provided by a fan to be switched between a first air strength and a second air strength, where the second air strength is different from the first air strength.

The first control signal is configured to control an air outflow strength of the fan. For example, a higher rotational speed of the fan indicates a greater air outflow strength of the fan.

In this embodiment of the present disclosure, the first control signal controls the air strength provided by the fan to be switched between the first air strength and the second air strength periodically, instead of being switched between the first air strength and the second air strength at one time. The first control signal controls the air strength provided by the fan to be periodically switched between the first air strength and the second air strength at least M times, M here being a positive integer greater than or equal to 2.

Because the second air strength is different from the first air strength, the dirt, foreign objects, flying insects, or other objects to be cleaned inside the electronic device will experience force changes or switching under different air strengths, and are thus blown out of the electronic device through an opening in a housing of the electronic device in the case of the force changes, thereby implementing internal cleaning of the electronic device.

Generally, a fan of an IT device is designed to mainly focus to heat dissipation performance. By increasing an air circulation speed, the heat dissipation efficiency of the device is improved. To ensure system safety, the impact of dust is reduced by maintaining the environment of a machine room.

In this embodiment of the present disclosure, a fan control unit is added to the IT device, and a pulsed airflow is formed by utilizing a maximum air strength and the minimum air strength of the fan, thereby achieving the purpose of cleaning dust away. The fan control unit may be implemented by various functional modules capable of processing information in devices such as the CPU.

After a system of the IT device is powered on, pulse cleaning is immediately performed once, to update the state of the computing power board. The pulse cleaning herein is a process of using high-frequency periodic switching of a pulse signal to control the switching of the air strength of the fan, to implement cleaning, referred to as pulse cleaning.

To prevent pulsed airflows from being simultaneously formed for all devices, thus causing stress on power supply of the machine room, after being powered on, each device undergoes a random delay before pulse cleaning (measured in hours).

According to the solution provided in this embodiment of the present disclosure, light dust and insect bodies that may affect a circuit of the computing power board can be effectively cleaned away.

After the IT device runs for a long time, dust will be accumulated inside the system due to static electricity, affecting heat dissipation. Operation and maintenance personnel are then required to perform irregular cleaning to ensure system cleanliness and safety.

To lower the impact of dust on the system running for a long time, the pulsed airflow is used to clean the dust and foreign objects attached to the interior of the system, which increases the life of the system and also reduces the difficulty and workload of operation and maintenance.

In the solution provided in this embodiment of the present disclosure, a separate self-cleaning process is created to monitor the system state, and the dust attached to the computing power board is cleaned away by means of pulse control of the fan in two cases.

The computing power board may be a circuit board installed with the CPU, the GPU, or other processors having a computing function. The circuit board here is a type of the foregoing heat generation module.

In the solution provided in this embodiment of the present disclosure, a separate self-cleaning process is created to monitor the system state, and the dust attached to the computing power board is cleaned away by means of pulse control of the fan in two cases.

Figure 4:
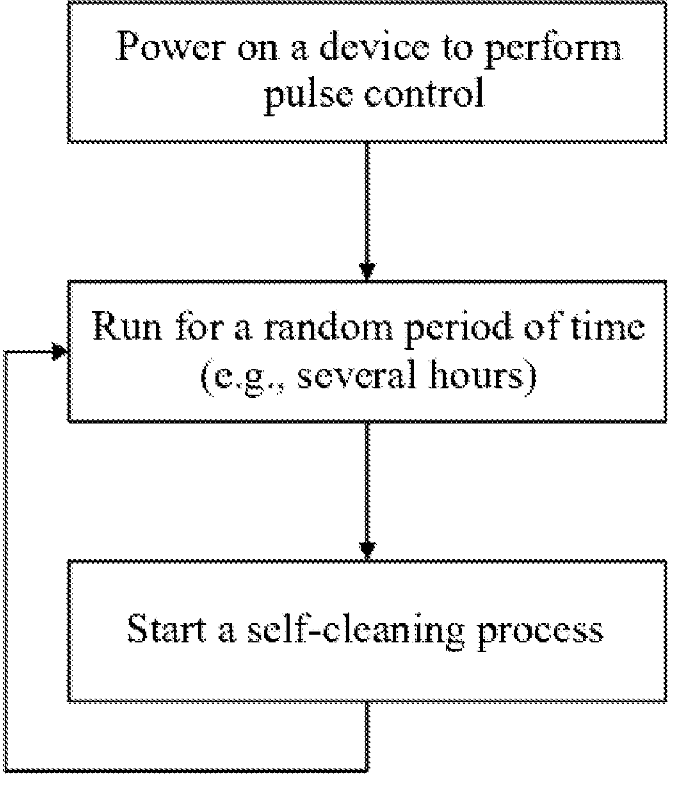
FIG. 4 is a schematic diagram of running of an electronic device according to an exemplary embodiment.

In the solution provided in this embodiment of the present disclosure, dust accumulation caused by static electricity can be effectively reduced, and insects accidentally entering the miner can also be effectively removed and cleared. The electronic device including the IT device provided in this embodiment of the present disclosure is running, as shown in FIG. 4. The device is powered on, and the device performs pulse control after being powered on, so as to generate the foregoing first control signal and/or second control signal. Here, both the first control signal and the second control signal are PWM signals for controlling the fan in the electronic device.

After the device is powered on and runs for a random period of time, for example, after the device is powered on and runs for several hours, a self-cleaning process is started.

Here, the self-cleaning process may include:

controlling, by means of the pulse control, the fan to alternately switch between different air strengths, so as to implement cleaning inside the device.

Figure 5:
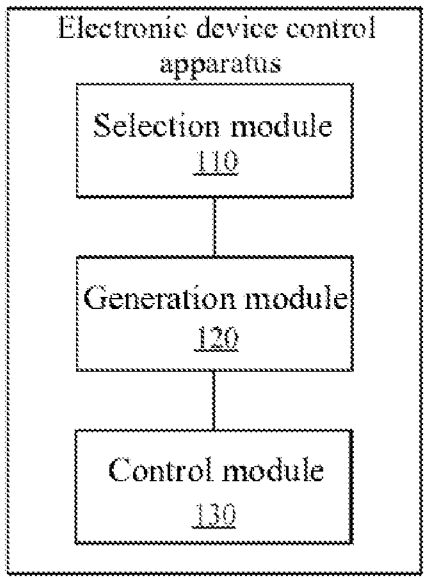
FIG. 5 is a schematic diagram of a structure of an electronic device control apparatus according to an exemplary embodiment.

As shown in FIG. 5, an embodiment of the present disclosure provides an electronic device control apparatus. The apparatus includes:

a selection module 110 configured to select a target mode from optional modes of a fan of an electronic device, the optional modes including a cleaning mode and a heat dissipation mode, where in the cleaning mode, the fan provides at least two different air strengths, and in the heat dissipation mode, the fan provides a single air strength when a heat dissipation level is not switched;

a generation module 120 configured to generate a control signal based on the target mode; and a control module 130 configured to control, based on the control signal, the fan to provide an air strength.

In some embodiments, the selection module 110, the generation module 120, and the control module 130 may be program modules. After the program modules are executed by a processor, the functions of any of the above modules can be implemented.

In some other embodiments, the selection module 110, the generation module 120, and the control module 130 may be combined software and hardware modules. The combined software and hardware modules include, but not limited to, various programmable arrays, and the programmable arrays include, but not limited to, a field-programmable array and/or a complex programmable array.

In still other embodiments, the selection module 110, the generation module 120, and the control module 130 may further include pure hardware modules. The pure hardware modules include, but not limited to, application-specific integrated circuits.

In some embodiments, the generation module 120 is specifically configured to generate a first control signal if the target mode is the cleaning mode, where the first control signal includes at least two pulse width modulation (PWM) signals with different duty cycles; or the first control signal includes at least two direct current (DC) control signals with different high voltage values.

In some embodiments, the generation module 120 is specifically configured to generate a second control signal if the target mode is the heat dissipation mode, where the second control signal is a PWM signal with a single duty cycle or a DC signal with a single voltage value.

In some embodiments, the selection module 110 is specifically configured to: select the cleaning mode as the target mode at a cleaning time; and select the heat dissipation mode as the target mode at a time other than the cleaning time.

In some embodiments, the apparatus further includes:

a first determination module configured to determine a cleaning delay; and a second determination module configured to determine the cleaning time based on the cleaning delay.

In some embodiments, the first determination module is specifically configured to perform at least one of operations of:

determining the cleaning delay after the electronic device is powered on;

determining the cleaning delay after the electronic device is powered on and runs for a preset duration;

determining the cleaning delay after the electronic device has completed previous cleaning; and determining the cleaning delay based on a predetermined period after the electronic device is powered on and has completed first-time cleaning.

In some embodiments, the first determination module is specifically configured to perform at least one of operations of:

determining the cleaning delay based on a randomized algorithm;

determining the cleaning delay based on a device number of the electronic device;

determining the cleaning delay based on a local area network address of the electronic device in a local area network where the electronic device is located; and determining the cleaning delay based on a group number of a device group to which the electronic device belongs.

In some embodiments, the running status information includes load status information indicating a load status of the electronic device and/or temperature status information indicating an internal temperature status of the electronic device; and the apparatus further includes a third determination module, where the third determination module is specifically configured to: determine, based on the load status information, the time at which a load rate of the electronic device is lower than a load threshold as the cleaning time; and/or determine, based on the temperature status information, the time at which a temperature value of the powered-on electronic device is lower than a preset temperature value as the cleaning time.

In some embodiments, the generation module 120 is specifically configured to: obtain a minimum air strength required to dissipate heat from the electronic device if the target mode is the cleaning mode; and generate the control signal based on the minimum air strength required to dissipate heat from the electronic device, where the control signal controls a minimum air strength provided by the fan to be greater than or equal to the minimum air strength required to dissipate heat from the electronic device.

An embodiment of the present disclosure provides an electronic device. The electronic device includes:

a memory configured to store processor-executable instructions; and a processor connected to the memory, where the processor is configured to perform an electronic device control method according to any of the foregoing technical solutions.

The processor may include various types of storage media. The storage media are non-transitory computer storage media capable of continuing to memorize information stored on the electronic device when the electronic device is powered off.

Herein, the electronic device includes the foregoing mobile terminal or server. The processor and the memory included in the electronic device are a type of the foregoing heat generation module, and the electronic device further includes a fan. The fan, the processor, and the memory are all located in a housing of the electronic device.

The processor may be connected to the memory through a bus, etc., and is configured to read executable programs stored on the memory, such as to perform at least one of the methods shown in FIGS. 1, 3, and 4.

Figure 6:
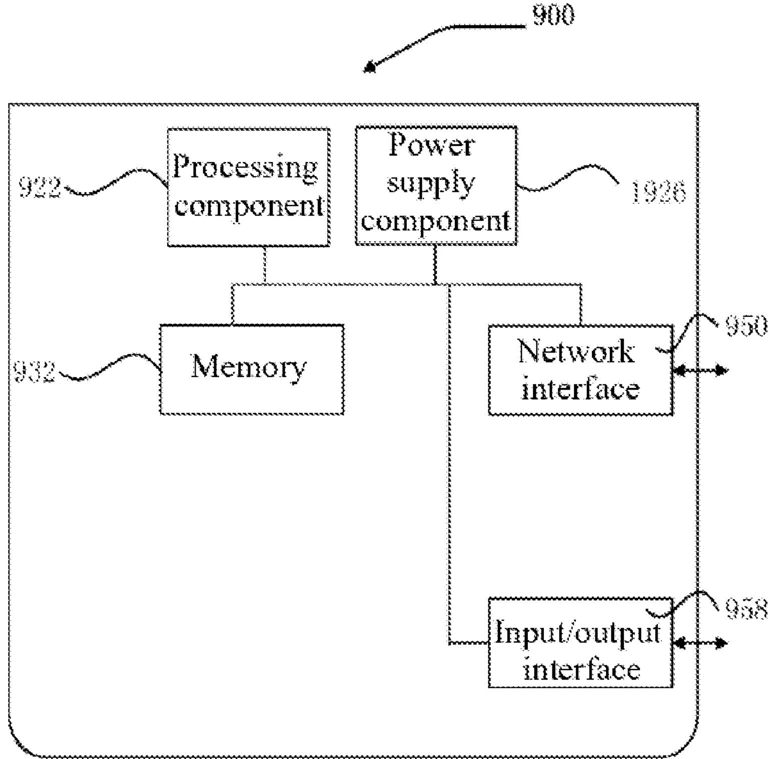
FIG. 6 is a schematic diagram of a structure of an electronic dual-color board according to an exemplary embodiment.

An embodiment of the present disclosure illustrates a structure of an electronic device. Referring to FIG. 6, a base station of the electronic device 900 is shown. The electronic device 900 includes: a processing component 922, which further includes one or more processors; and a memory resource represented by a memory 932, which is configured to store instructions executable by the processing component 922, such as an application program. The application program stored in the memory 932 may include one or more modules each corresponding to a set of instructions. In addition, the processing component 922 is configured to perform instructions so as to perform any of the foregoing methods applied to the base station, such as at least one of the methods shown in FIGS. 6 to 8.

The electronic device 900 may further include a power supply component 926 configured to perform power supply management of the electronic device 900, a wired or wireless network interface 950 configured to connect the electronic device 900 to the Internet, and an input/output (I/O) interface 958. The electronic device 900 may be operated based on an operating system stored in the memory 932, such as Windows Server™, Mac OS X™, Unix™, Linux™, FreeBSD™, or the like.

An embodiment of the present disclosure provides a non-transitory computer-readable storage medium storing instructions that, when executed by a processor of a user equipment (UE), enable the UE to perform the electronic device control method according to any of the foregoing embodiments, such as to perform at least one of the electronic device control methods shown in FIGS. 1, 3, and 4.

In an embodiment, the electronic device control method may include: selecting a target mode from optional modes of a fan of an electronic device, the optional modes including a cleaning mode and a heat dissipation mode, where in the cleaning mode, the fan provides at least two different air strengths, and in the heat dissipation mode, the fan provides a single air strength when a heat dissipation level is not switched; generating a control signal based on the target mode; and controlling, based on the control signal, the fan to provide an air strength.

It is to be understood that the generating a control signal based on the target mode includes: generating a first control signal if the target mode is the cleaning mode, where the first control signal includes at least two pulse width modulation (PWM) signals with different duty cycles; or the first control signal includes at least two direct current (DC) control signals with different high voltage values.

It is to be understood that the generating a control signal based on the target mode includes:

generating a second control signal if the target mode is the heat dissipation mode, where the second control signal is a PWM signal with a single duty cycle or a DC signal with a single voltage value.

It is to be understood that the selecting a target mode from optional modes of a fan of an electronic device includes: selecting the cleaning mode as the target mode at a cleaning time; and selecting the heat dissipation mode as the target mode at a time other than the cleaning time.

It is to be understood that the method further includes: determining a cleaning delay; and determining the cleaning time based on the cleaning delay.

It is to be understood that the determining a cleaning delay includes at least one of: determining the cleaning delay after the electronic device is powered on; determining the cleaning delay after the electronic device is powered on and runs for a preset duration; determining the cleaning delay after the electronic device has completed previous cleaning; and determining the cleaning delay based on a predetermined period after the electronic device is powered on and has completed first-time cleaning.

It is to be understood that the determining a cleaning delay includes at least one of: determining the cleaning delay based on a randomized algorithm; determining the cleaning delay based on a device number of the electronic device; determining the cleaning delay based on a local area network address of the electronic device in a local area network where the electronic device is located; and determining the cleaning delay based on a group number of a device group to which the electronic device belongs.

It is to be understood that the running status information includes load status information indicating a load status of the electronic device and/or temperature status information indicating an internal temperature status of the electronic device; and the method further includes: determining, based on the load status information, the time at which a load rate of the electronic device is lower than a load threshold as the cleaning time; and/or determining, based on the temperature status information, the time at which a temperature value of the powered-on electronic device is lower than a preset temperature value as the cleaning time.

It is to be understood that the generating a control signal based on the target mode includes: obtaining a minimum air strength required to dissipate heat from the electronic device if the target mode is the cleaning mode; and generating the control signal based on the minimum air strength required to dissipate heat from the electronic device, where the control signal controls a minimum air strength provided by the fan to be greater than or equal to the minimum air strength required to dissipate heat from the electronic device.

In some other embodiments, the electronic device control method is used for cleaning an electronic device including a fan and a heat generation module, where the fan is used for dissipating heat from the heat generation module. The device control method includes: generating a first control signal; and controlling, based on the first control signal, an air strength provided by a fan to be switched between a first air strength and a second air strength, where the second air strength is different from the first air strength.

It is to be understood that the first control signal includes a pulse width modulation (PWM) signal with a first period and a PWM signal with a second period where the second period is different from the first period:

- the PWM signal with the first period is configured to control the fan to provide the first air strength; and
- the PWM signal with the second period is configured to control the fan to provide the second air strength.

It is to be understood that the PWM signals included in the first control signal are switched, with a first duration as a switching duration, between the PWM signal with the first period and the PWM signal with the second period, where the first duration is at least greater than the larger one of the first period and the second period.

It is to be understood that the generating a first control signal includes generating the first control signal within a second duration, where the second duration is N times of the first duration, N being a positive integer greater than or equal to 2.

It is to be understood that the method further includes determining a cleaning time, and the generating a first control signal includes generating the first control signal at the cleaning time.

Based on the above solution, the determining a cleaning time includes: determining a cleaning delay; and determining the cleaning time based on the cleaning delay.

It is to be understood that the determining a cleaning delay includes at least one of:

- determining the cleaning delay after the electronic device is powered on;
- determining the cleaning delay after the electronic device is powered on and runs for a preset duration;

determining the cleaning delay after the electronic device has completed previous cleaning; and determining the cleaning delay based on a predetermined period after the electronic device is powered on and has completed first-time cleaning.

It is to be understood that the determining a cleaning delay includes at least one of:

determining the cleaning delay based on a randomized algorithm;

determining the cleaning delay based on a device number of the electronic device;

determining the cleaning delay based on a local area network address of the electronic device in a local area network where the electronic device is located; and determining the cleaning delay based on a group number of a device group to which the electronic device belongs.

It is to be understood that the method further includes:

generating a second control signal after the electronic device is cleaned, where the second control signal includes a PWM signal with a single period, and is configured to control the fan to provide an air strength uniformly.

It is to be understood that the first air strength includes a maximum air strength that the fan can provide; and the second air strength includes a minimum air strength that the fan can provide.

It is to be understood that the determining a cleaning time includes: determining running status information of the electronic device; and determining the cleaning time based on the running status information.

It is to be understood that the running status information includes load status information indicating a load status of the electronic device and/or temperature status information indicating an internal temperature status of the electronic device; and The determining the cleaning time based on the running state includes: determining, based on the load status information, the time at which a load rate of the electronic device is lower than a load threshold as the cleaning time; and/or determining, based on the temperature status information, the time at which a temperature value of the powered-on electronic device is lower than a preset temperature value as the cleaning time.

Other implementations of the present disclosure would readily occur to a person skilled in the art after considering the description and the practice of the disclosure disclosed herein. The present disclosure is intended to cover any variation, usage or adaptation change of the present disclosure, which follow the general principles of the present disclosure and include common general knowledge or customary technical means in the art that are not disclosed in the present disclosure. The description and embodiments are merely to be regarded exemplary, while the true scope and spirit of the present disclosure are indicated by the claims below.

It should be understood that the present disclosure is not limited to the precise structures described and shown in the accompanying drawings, and various modifications and changes may be made without departing from the scope thereof. The scope of the present disclosure is merely defined by the appended claims.

The invention claimed is:

1. An electronic device control method, comprising:

selecting a target mode from optional modes of a fan of an electronic device, the optional modes comprising a cleaning mode and a heat dissipation mode, wherein in the cleaning mode, the fan automatically and repeatedly switches between at least two air strengths, and in the heat dissipation mode, the fan provides a single air strength when a heat dissipation level is not switched;

generating a control signal based on the target mode; and controlling, based on the control signal, the fan to provide an air strength;

wherein the generating the control signal based on the target mode comprises:

obtaining a minimum air strength required to dissipate heat from the electronic device if the target mode is the cleaning mode; and generating the control signal based on the minimum air strength required to dissipate heat from the electronic device, wherein the control signal controls a minimum air strength provided by the fan to be greater than or equal to the minimum air strength required to dissipate heat from the electronic device.

2. The method according to claim 1, wherein the generating the control signal based on the target mode comprises:

generating a first control signal if the target mode is the cleaning mode, wherein the first control signal comprises at least two pulse width modulation (PWM) signals with different duty cycles; or the first control signal comprises at least two direct current (DC) control signals with different high voltage values.

3. The method according to claim 1, wherein the generating the control signal based on the target mode comprises:

generating a second control signal if the target mode is the heat dissipation mode, wherein the second control signal is a PWM signal with a single duty cycle or a DC signal with a single voltage value.

4. The method according to claim 1, wherein the selecting the target mode from the optional modes of the fan of the electronic device comprises:

selecting the cleaning mode as the target mode at a cleaning time; and selecting the heat dissipation mode as the target mode at a time other than the cleaning time.

5. The method according to claim 4, wherein running status information comprises load status information indicating a load status of the electronic device and/or temperature status information indicating an internal temperature status of the electronic device; and the method further comprises:

determining, based on the load status information, a time at which a load rate of the electronic device is lower than a load threshold as the cleaning time;

and/or determining, based on the temperature status information, the time at which a temperature value of the powered-on electronic device is lower than a preset temperature value as the cleaning time.

6. The method according to claim 4, wherein the method further comprises:

determining a cleaning delay; and determining the cleaning time based on the cleaning delay.

7. The method according to claim 6, wherein the determining the cleaning delay comprises at least one of:

determining the cleaning delay after the electronic device is powered on;

determining the cleaning delay after the electronic device is powered on and runs for a preset duration;

determining the cleaning delay after the electronic device has completed previous cleaning; and determining the cleaning delay based on a predetermined period after the electronic device is powered on and has completed first-time cleaning.

8. The method according to claim 7, wherein the determining the cleaning delay comprises at least one of:

determining the cleaning delay based on a randomized algorithm;

determining the cleaning delay based on a device number of the electronic device;

determining the cleaning delay based on a local area network address of the electronic device in a local area network where the electronic device is located; and determining the cleaning delay based on a group number of a device group to which the electronic device belongs.

9. A non-transitory computer-readable storage medium storing instructions that, when executed by a processor of a computer, enable the computer to perform an electronic device control method according to claim 1.

10. An electronic device, comprising:

a memory configured to store processor-executable instructions; and a processor connected to the memory, wherein the processor is configured to perform:

select a target mode from optional modes of a fan of an electronic device, the optional modes comprising a cleaning mode and a heat dissipation mode, wherein in the cleaning mode, the fan automatically and repeatedly switches between at least two air strengths, and in the heat dissipation mode, the fan provides a single air strength when a heat dissipation level is not switched;

generate a control signal based on the target mode; and control, based on the control signal, the fan to provide an air strength;

wherein the processor is specifically configured to: obtain a minimum air strength required to dissipate heat from the electronic device if the target mode is the cleaning mode; and generate the control signal based on the minimum air strength required to dissipate heat from the electronic device, wherein the control signal controls a minimum air strength provided by the fan to be greater than or equal to the minimum air strength required to dissipate heat from the electronic device.

11. The device according to claim 10, wherein the processor is specifically configured to generate a first control signal if the target mode is the cleaning mode, wherein the first control signal comprises at least two pulse width modulation (PWM) signals with different duty cycles; or the first control signal comprises at least two direct current (DC) control signals with different high voltage values.

12. The device according to claim 10, wherein the processor is specifically configured to generate a second control signal if the target mode is the heat dissipation mode, wherein the second control signal is a PWM signal with a single duty cycle or a DC signal with a single voltage value.

13. The device according to claim 10, wherein the processor is specifically configured to: select the cleaning mode as the target mode at a cleaning time; and select the heat dissipation mode as the target mode at a time other than the cleaning time.

14. The device according to claim 13, wherein running status information comprises load status information indicating a load status of the electronic device and/or temperature status information indicating an internal temperature status of the electronic device; and wherein the processor is specifically configured to: determine, based on the load status information, the time at which a load rate of the electronic device is lower than a load threshold as the cleaning time; and/or determine, based on the temperature status information, the time at which a temperature value of the powered-on electronic device is lower than a preset temperature value as the cleaning time.

15. The device according to claim 13, wherein the processor is further configured to:

determine a cleaning delay; and determine the cleaning time based on the cleaning delay.

16. The device according to claim 15, wherein the processor is specifically configured to perform at least one of operations of:

determining the cleaning delay after the electronic device is powered on;

determining the cleaning delay after the electronic device is powered on and runs for a preset duration;

determining the cleaning delay after the electronic device has completed previous cleaning; and determining the cleaning delay based on a predetermined period after the electronic device is powered on and has completed first-time cleaning.

17. The device according to claim 16, wherein the processor is specifically configured to perform at least one of operations of:

determining the cleaning delay based on a randomized algorithm;

determining the cleaning delay based on a device number of the electronic device;

determining the cleaning delay based on a local area network address of the electronic device in a local area network where the electronic device is located; and determining the cleaning delay based on a group number of a device group to which the electronic device belongs.

* * * * *